(12) United States Patent
Hanawa et al.

(10) Patent No.: US 6,334,905 B1
(45) Date of Patent: Jan. 1, 2002

(54) UNLEADED SOLDER POWDER AND PRODUCTION METHOD THEREFOR

(75) Inventors: Kenzo Hanawa, Chiba; Kiyotaka Yanagi, Saitama, both of (JP)

(73) Assignee: Mitsui Mining and Smelting Company, Ltd., Tokyo (JP)

(*) Notice: Subject to any disclaimer, the term of this patent is extended or adjusted under 35 U.S.C. 154(b) by 0 days.

(21) Appl. No.: 09/555,478

(22) PCT Filed: Oct. 1, 1999

(86) PCT No.: PCT/JP99/05406

§ 371 Date: Jun. 1, 2000

§ 102(e) Date: Jun. 1, 2000

(87) PCT Pub. No.: WO00/20161

PCT Pub. Date: Apr. 13, 2000

(30) Foreign Application Priority Data

Oct. 1, 1998 (JP) ............................................. 10-279829

(51) Int. Cl.⁷ ............................................. B23K 35/365
(52) U.S. Cl. ......................... 148/23; 148/24; 428/403; 427/216
(58) Field of Search ...................... 148/23, 24; 428/403, 428/402; 427/216

(56) References Cited

U.S. PATENT DOCUMENTS 5,045,127 A * 9/1991 Dershem et al. ............... 148/23
5,435,857 A * 7/1995 Han et al. ...................... 148/24
5,439,639 A * 8/1995 Vianco et al. ............... 420/562
5,452,842 A * 9/1995 Melton et al. ......... 228/180.22
5,527,628 A * 6/1996 Anderson et al. ........... 428/647
5,837,191 A * 11/1998 Gickler ....................... 420/560
6,123,248 A * 9/2000 Tadauchi et al. ......... 228/111.5

FOREIGN PATENT DOCUMENTS

| EP | 0 556 864 | 8/1993 |
|---|---|---|
| JP | 3-216292 | 9/1991 |
| JP | 4-111993 | 4/1992 |
| JP | 6-63788 | 3/1994 |
| JP | 8-164496 | 6/1996 |
| JP | 9-327789 | 12/1997 |
| JP | 10-006074 | 1/1998 |
| JP | 10058190 | 3/1998 |

* cited by examiner

Primary Examiner—Daniel J. Jenkins
(74) Attorney, Agent, or Firm—Young & Thompson

(57) ABSTRACT

A lead-free solder in which oxidation of the powder surface with time is prevented and a process for preparing the same. The lead-free solder powder has tin-zinc or tin-zinc-bismuth as a major composition and forms an organometallic compound of malonic acid and a metal of the solder alloy powder on the surface of solder alloy powder containing no lead.

7 Claims, No Drawings

UNLEADED SOLDER POWDER AND PRODUCTION METHOD THEREFOR

TECHNICAL FIELD

This invention relates to lead-free solder powder which has formed thereon a protective film of an organometallic compound of malonic acid and is prevented from oxidation with time and to a process for preparing the same.

BACKGROUND ART

In recent years, size reduction of wiring boards used in electronic equipment has brought about swift development of surface mounting technology. Soldering paste is used in surface mounting. Tin-lead-based solder, which has been of very long use, is generally used. However, where electronic equipment is disposed as general industrial waste and left to stand in the environment, the lead component in solder used in wiring boards dissolves and penetrates into underground water, which has given rise to a problem to the human body.

Hence, lead-free solder containing no lead has been developed intensively. In particular, tin-silver-based solder has practically the same characteristics as those of conventional tin-lead-based solder in terms of mechanical characteristics and handling properties. However, it is expensive and has a high melting point, which has been a bar to spread of the solder of this composition.

On the other hand, tin-zinc-based solder or tin-zinc-bismuth-based solder is almost equal to tin-lead-based solder in melting point and rather superior to tin-lead eutectic solder in mechanical characteristics. In addition, it is almost equal in cost. Despite these advantages, it is very susceptible to oxidation. As a result, the solder tends to develop solder balls, and the soldering paste tends to increase viscosity during storage or exhibit extremely deteriorated wetting or develop many voids.

Although use of a flux having very high activity is a conceivable solution to these problems, this not only necessitates washing after soldering but involves a fear of corrosion by the residual flux, which may impair reliability after soldering.

A method comprising treating the surface with a stable metal, such as tin or nickel, was proposed as disclosed in Japanese Patent Application Laid-Open No. 164496/96. However, the method is very costly, involving such steps as alkali degreasing, oxide film removal, lead activation, and nickel plating. This impairs the merit of relatively low cost of tin-zinc-based solder.

Further, Japanese Patent Application Laid-Open No. 58190/98 teaches a surface treating method for preventing oxidation of solder powder, e.g., tin-lead-based solder powder, which comprises forming a metallic compound of adipic acid on the surface of the powder. According to this method, however, adipic acid forms an organometallic compound chiefly with lead in the solder powder. Therefore, the oxidation preventing effect on tin-zinc-based solder powder or tin-zinc-bismuth-based solder powder is not sufficient.

To use no lead in solder powder is a social demand as stated above. In order to meet the demand it has been desired to effectively prevent surface oxidation of the above-described tin-zinc-based solder powder or tin-zinc-bismuth-based solder powder.

Accordingly, an object of the present invention is to provide lead-free solder powder which has tin-zinc or tin-zinc-bismuth as a main composition and is effectively prevented from surface oxidation and a process for preparing the same.

DISCLOSURE OF THE INVENTION

As a result of extensive studies, the present inventors have found that the above object is accomplished by forming, on the surface of solder alloy powder having tin-zinc or tin-zinc-bismuth as a main composition, an organometallic compound formed of malonic acid and a metal of the solder alloy powder.

Having been completed based on the above finding, the present invention provides lead-free solder powder characterized in that solder alloy powder having tin-zinc or tin-zinc-bismuth as a main composition and containing no lead has formed on the surface thereof an organometallic compound formed of malonic acid and a metal of said solder alloy.

The present invention also provides a preferred process for preparing the lead-free solder powder of the present invention, which is characterized by comprising allowing lead-free solder alloy powder having tin-zinc or tin-zinc-bismuth as a main composition to react with vapor of vaporized malonic acid to form an organometallic compound of a metal in the solder alloy powder and malonic acid on the surface of the solder alloy powder.

BEST MODE FOR CARRYING OUT THE INVENTION

The present invention will be described below in detail.

In the present invention solder alloy powder which has tin-zinc or tin-zinc-bismuth as a main composition and contains no lead is used. Containing no lead, such solder alloy powder meets the social demand. Also, the solder alloy is advantageous as mentioned above in that it is almost equal in melting point to the conventionally used tin-lead-based solder powder, rather superior in mechanical characteristics to tin-lead eutectic solder, and is almost equal in cost.

The solder alloy powder has a particle size of 10 to 40 $\mu$m, preferably 20 to 40 $\mu$m. If the particle size of the solder alloy powder is smaller than 10 $\mu$m, the powder undergoes oxidation so violently during preparation that solder ball development cannot be prevented by the surface treatment. On the other hand, there is a tendency that boards become more compact in the future so that the components to be surface-mounted thereon will be reduced in size, and the wiring pitch will be narrowed accordingly. Therefore, the upper limit of the particle size of the solder alloy powder is 40 $\mu$m.

The lead-free solder powder of the present invention has on the surface thereof an organometallic compound formed of malonic acid and a metal of the solder alloy. The metal of the solder alloy which forms the organometallic compound chiefly includes zinc. Zinc reacts with the carboxyl groups of malonic acid to form a firm organometallic compound. Such an action is observed only with malonic acid. Adipic acid, which is also a dibasic acid, forms a firm organometallic compound with tin-lead-based solder alloy powder but is incapable of forming an organometallic compound as firm as that formed by malonic acid with solder alloy powder having tin-zinc or tin-zinc-bismuth as a main composition.

In the present invention the amount of malonic acid to be adhered to the solder alloy powder is preferably 0.01 to 1.0% by weight, still preferably 0.03 to 0.6% by weight, particularly preferably 0.05 to 0.5% by weight, based on the whole solder powder, in terms of malonic acid when the organometallic compound on the surface of the solder alloy powder is extracted with an acid. If the above-described converted amount is less than 0.01% by weight, the effect of the malonic acid in forming a protective film, i.e., the effect in preventing oxidation of the solder powder during handling, is weak, and the effect in inhibiting solder balls development is reduced. On the other hand, if the converted amount exceeds 1.0% by weight, the increased amount of malonic acid causes the solder powder to agglomerate during handling. Such powder is difficult to make into paste due to poor dispersibility, failing to achieve effects as expected for the increased cost.

The process of preparation according to the invention will then be explained.

In the present invention the solder alloy powder having the above-mentioned composition is allowed to react with vapor of vaporized malonic acid to form an organometallic compound of a metal in the solder alloy powder and malonic acid on the surface of the solder alloy powder.

The lead-free solder powder having, on the surface thereof, an organometallic compound formed of a metal in the solder alloy powder and malonic acid is preferably obtained by a process comprising vaporizing malonic acid and allowing the vapor to react onto the surface of solder alloy powder. The process can be embodied by a method comprising vaporizing malonic acid and spraying the vapor to solder alloy powder and a method comprising mixing malonic acid with solder alloy powder and heating the mixture. In order for malonic acid to form an organometallic compound on the surface of solder alloy powder, it is necessary to raise the temperature above room temperature.

A suitable treating temperature is from 50 to 120° C.; for the decomposition temperature of malonic acid is about 140° C. If the treating temperature is too low, e.g., below 50° C., malonic acid fails to form an organometallic compound on the surface of the solder alloy powder. If the treating temperature is as high as exceeding 120° C., the solder alloy powder begins to sinter to form unfavorable big lumps.

In order to perform the reaction between malonic acid and zinc efficiently, it is required to carry out the treatment while minimizing oxidation of the solder alloy powder. The treating is desirably conducted in an inert gas atmosphere, such as argon gas, under high vacuum having a high degree of vacuum of $10^{-1}$ Torr or less.

The amount of malonic acid to be added corresponds to the amount to be adhered to the solder alloy powder, while depending on the particle size of the solder alloy powder. It is suitably 0.01 to 1.0% by weight. If the amount to be added is less than 0.01% by weight, one cannot expect the effect of addition because malonic acid fails to cover the entire surface of the solder alloy powder. If the amount exceeds 1.0% by weight, part of malonic acid which has not formed an organometallic compound remains on the surface and dissolves in the solvent of a flux. As a result, the resulting paste is liable to denature, which is unfavorable, too. A preferred amount of malonic acid to be added is from 0.05 to 0.5% by weight.

The lead-free solder powder according to the present invention is kneaded with an appropriate flux comprising a solvent, etc. to make lead-free soldering paste.

Since the lead-free solder powder of the present invention has gained a protective film of an organometallic compound formed by a metal in the solder alloy bound to malonic acid, it is prevented from being oxidized after the preparation and during storage. It is also prevented from oxidation during all the handling steps including a step of making the lead-free solder powder into paste, a printing step, a step of transferring to a reflow furnace, a reflow step, and the like so that solder balls which may develop in using the powder in a paste form can be suppressed as much as possible. This allows reduction of the amount of an activator in the flux used to the required minimum or makes an activator, such as an amine, unnecessary, which can permit omission of washing with Freon. Thus, there are provided lead-free solder powder and lead-free soldering paste which are extremely suited to microsoldering mounting technology for electronic circuits and the like that are being reduced in size and weight.

The present invention will be described in greater detail by way of Examples. The percents in Table 1 are by weight.

EXAMPLE 1

An alloy powder consisting of Sn, 8 wt % of Zn, and 2 wt% of Bi was prepared by a rotary disk method and passed through a screen to obtain a solder alloy powder of 20 to 40 μm.

In a 200 ml separable flask placed in a mantle heater was put 0.5 g of malonic acid (corresponding to 0.05 wt % based on the solder alloy powder) and heated to 150° C. A three-necked stopper was used. The central port was connected to a thermometer, and the other two ports were connected to respective copper pipes. Argon gas was made to flow as a carrier gas through one of the copper pipe at a rate of 10 ml/min. A 1000 ml sample bottle stopped with a rubber stopper was prepared, and two copper pipes were connected thereto. The argon gas containing vaporized malonic acid was introduced into the sample bottle through one of the copper pipes, and the other copper pipe, equipped with a check valve, was an outlet for the malonic acid. The malonic acid was released into the air after being absorbed by ethanol.

One kilogram of the above-described solder alloy powder was put into the sample bottle. The sample bottle was immersed in an oil bath up to the height of the solder alloy powder and kept at 110° C. for 5 hours while introducing argon gas. At this time, the degree of vacuum in the container was $1 \times 10^{-2}$ Torr. When the malonic acid in the separable flask was consumed, argon gas feed was stopped, and the sample bottle was cooled in a water bath at 20° C. After cooling to room temperature, the resulting lead-free solder powder was taken out.

The amount of the malonic acid adhered was found to be 0.05 wt % in terms of malonic acid as measured with a thermobalance.

EXAMPLE 2

The same procedure as in Example 1 was repeated, except that the amount of malonic acid put in a separable flask was changed to 0.75 g (corresponding to 0.075 wt % based on the solder alloy powder), to obtain lead-free solder powder. The amount of the malonic acid adhered was found to be 0.075 wt % in terms of malonic acid as measured with a thermobalance.

EXAMPLE 3

The same procedure as in Example 1 was repeated, except that the amount of malonic acid put in a separable flask was changed to 1 g (corresponding to 0.1 wt % based on the solder alloy powder), to obtain lead-free solder powder. The amount of the malonic acid adhered was found to be 0.1 wt % in terms of malonic acid as measured with a thermobalance.

EXAMPLE 4

The same procedure as in Example 1 was repeated, except that the amount of malonic acid put in a separable flask was changed to 5 g (corresponding to 0.5 wt % based on the solder alloy powder), to obtain lead-free solder powder. The amount of the malonic acid adhered was found to be 0.5 wt % in terms of malonic acid as measured with a thermobalance.

EXAMPLE 5

The same procedure as in Example 1 was repeated, except that the amount of malonic acid put in a separable flask was changed to 10 g (corresponding to 1.0 wt % based on the solder alloy powder), to obtain lead-free solder powder. The amount of the malonic acid adhered was found to be 1.0 wt % in terms of malonic acid as measured with a thermobalance.

COMPARATIVE EXAMPLE 1

The solder alloy powder used in Example 1, given no treatment, was taken as lead-free solder powder.

COMPARATIVE EXAMPLE 2

The same procedure as in Example 1 was repeated, except that 1.5 g (corresponding to 0.15 wt % based on the solder alloy powder) of adipic acid was put in a separable flask in place of malonic acid, to obtain lead-free solder powder. The amount of the adipic acid adhered was found to be 0.15 wt % in terms of adipic acid as measured with a thermobalance.

In a 10 ml polyethylene container were put 1.05 g of each of the lead-free solder powders obtained in Examples 1 to 5 and Comparative Examples 1 and 2 and 0.25 g of a flux (comprising 60 wt % of rosin, 30 wt % of butyl carbitol, and 9 wt % of hydrogenated castor oil) and kneaded with a spatula for 5 minutes to prepare a lead-free solder paste.

These lead-free pastes were stored under conditions of 25° C. and 60% RH. The time required for the paste to become too hard to stir with a spatula was taken as a measure for evaluating viscosity stability. The results obtained are shown in Table 1.

TABLE 1

| | | Surface Treating Conditions | | | Viscosity Stability |
|---|---|---|---|---|---|
| | | Additive | Treating | Treating | (paste |
| | Kind | Amount (%) | Time (hr) | Temp. (° C.) | hardening time*) |
| Example | 1 malonic acid | 0.05 | 5 | 110 | >168 hrs |
| | 2 malonic acid | 0.075 | 5 | 110 | >168 hrs |
| | 3 malonic acid | 0.1 | 5 | 110 | >168 hrs |
| | 4 malonic acid | 0.5 | 5 | 110 | >168 hrs |
| | 5 malonic acid | 1.0 | 5 | 110 | >168 hrs |
| Comparative Example | 1 untreated | | | | <48 hrs |
| | 2 adipic acid | 0.15 | 5 | 110 | <48 hrs |

*The time for the paste to harden when stored at 25° C. and 60% RH.

As shown in Table 1, Examples 1 to 5, which were prepared by surface treatment with malonic acid, had a paste hardening time of 168 hours or longer, exhibiting suitable viscosity stability, whereas Comparative Example 1 (untreated) and Comparative Example 2, which was prepared by surface treatment with adipic acid, were inferior in viscosity stability as indicated by their paste hardening time of 48 hours or shorter.

INDUSTRIAL APPLICABILITY

As described above, according to the present invention, lead-free solder alloy powder having tin-zinc or tin-zinc-bismuth as a main composition is effectively prevented from surface oxidation. The lead-free solder powder can be obtained with ease by the process of preparation according to the present invention.

What is claimed is:

1. Lead-free solder powder comprising a solder alloy powder having tin-zinc or tin-zinc-bismuth as a main composition and containing no lead and having formed on the surface thereof an organo-metallic compound formed of malonic acid and a metal of said solder alloy.

2. Lead-free solder powder as set forth in claim 1, wherein the metal forming said organometallic compound is zinc.

3. Lead-free solder powder as set forth in claim 1 which has a particle size of 10 to 40 μm.

4. Lead-free solder powder as set forth in claim 1, wherein the amount of malonic acid is 0.01 to 1.0% by weight based on the whole solder powder when the organometallic compound on the surface of the solder alloy powder is extracted with an acid.

5. Lead-free solder paste comprising the lead-free powder set forth in claim 1.

6. A process for preparing lead-free solder powder comprising the steps of allowing a solder alloy powder having tin-zinc or tin-zinc-bismuth as a main composition and containing no lead to react with a vapor of vaporized malonic acid to form an organometallic compound of a metal in said solder alloy powder with malonic acid on the surface of said solder alloy powder.

7. A process for preparing lead-free solder powder as set forth in claim 6, wherein the temperature of the reaction is 50 to 120° C.

* * * * *